(12) United States Patent
Li et al.

(10) Patent No.: US 6,899,164 B1
(45) Date of Patent: May 31, 2005

(54) HEAT SINK WITH GUIDING FINS

(75) Inventors: Nien-Lun Li, Hsin-Chuang (TW); Chin-Yueh Chu, Hsin-Chuang (TW)

(73) Assignee: Datech Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 10/787,311

(22) Filed: Feb. 27, 2004

(51) Int. Cl.[7] .................................................. F28F 7/00
(52) U.S. Cl. ...................... 165/80.3; 361/697; 361/704; 174/16.3; 257/706; 257/722
(58) Field of Search ............................... 165/80.3, 185; 361/695, 697, 703–710; 257/706, 722

(56) References Cited

U.S. PATENT DOCUMENTS

| | | | | |
|---|---|---|---|---|
| 3,566,959 A | * | 3/1971 | Koltuniak et al. | 165/80.3 |
| 4,715,438 A | * | 12/1987 | Gabuzda et al. | 165/185 |
| 4,823,869 A | * | 4/1989 | Arnold et al. | 165/185 |
| 5,844,313 A | * | 12/1998 | Hoffmann | 257/722 |
| 6,196,300 B1 | * | 3/2001 | Checchetti | 165/80.3 |
| 6,505,680 B1 | * | 1/2003 | Hegde | 165/80.3 |
| 6,598,667 B1 | * | 7/2003 | Kuo | 165/80.3 |
| 6,665,933 B2 | | 12/2003 | Tsai | 29/890.03 |
| 2004/0045701 A1 | * | 3/2004 | Chen et al. | 165/185 |

* cited by examiner

Primary Examiner—Terrell McKinnon
(74) Attorney, Agent, or Firm—Troxell Law Office, PLLC

(57) ABSTRACT

The present invention is a heat sink with guiding fins comprising a base with a plate part, wherein each side of a pair of two opposite sides of the plate part comprises a declining part; and two groups of fins expanded upwardly from each said declining part, wherein a channel whose top width is wider than its bottom width is form by the tow groups of fins and the base and there is a gap properly set between each two fins. By doing so, the heat sink can guide the flow generated by a fan to form a streamline with pressure and so obtains smaller wind resistance and better heat dissipation for the heat sink.

9 Claims, 7 Drawing Sheets

HEAT SINK WITH GUIDING FINS

FIELD OF THE INVENTION

The present invention relates to a heat sink with guiding fins. More particularly, the present invention relates to a heat sink with guiding fins which guides the flow generated by a fan attached the heat sink to form a streamline with pressure and so obtains smaller wind resistance and better heat dissipation.

DESCRIPTION OF THE PRIOR ART

Accordingly, the process of the prior art like the patent of 'Process for fabricating heat sink with high-density fins', U.S. Pat. No. 6,665,933 B2, comprises:

(1) providing a metal block comprising a first base being rectangular-solid shaped and a second base being rhombus-shaped and disposed over the first base, wherein the second base comprises a first edge surface and a second edge surface inclined at a specific angle;

(2) cutting the second base from a position on the top surface and parallel with the first edge surface until the first base is reached, thereby forming an inclined sheet;

(3) adjusting the inclined sheet to be perpendicular, thereby forming a fin; and (4) repeating the cutting and the adjusting to produce the heat sink with high-density parallel fins.

Although the heat sink made according to the above process can improve the manufacture method of the heat sink with a plurality of parallel fins or pin fins, the fan of the heat sink only guides the flow to the base through the gaps between the fins so that the wind resistance may be too big and the wind pressure may be quite possible not enough. So, this kind of heat sink can not achieve good heat dissipation on actual usage.

BRIEF SUMMARY OF THE INVENTION

Therefore, the purpose of the present invention is to produce a heat sink with guiding fins which guides the flow generated by a fan to form a streamline through the declining parts on both sides of the base and the concave part whose top width is wider than the bottom width. By ding so, the wind resistance of the flow becomes smaller and the heat dissipation of the present invention is better.

To achieve the above purpose, the present invention comprising a base having a plate part and two declining parts and two groups of fins extended up against the two declining parts. Therein, each side of two opposite sides of the plate part comprises a declining part; a plurality of fins are extended up against each of the declining part; a concave part whose top width is wider than its bottom width is formed by the plate part and the two groups of fins; and, there is a proper gap between each two of the neighboring fins. Accordingly, the flow generated by a fan attached to the heat sink is formed into a streamline and its pressure is bigger so that the wind resistance is smaller and the heat dissipation is better.

BRIEF DESCRIPTION OF THE DRAWINGS

The present invention will be better understood from the following detailed description of preferred embodiments of the invention, taken in conjunction with the accompanying drawings, in which.

DESCRIPTION OF THE PREFERRED EMBODIMENTS

The following descriptions of the preferred embodiments are provided to understand the features and the structures of the present invention.

Figure 1:
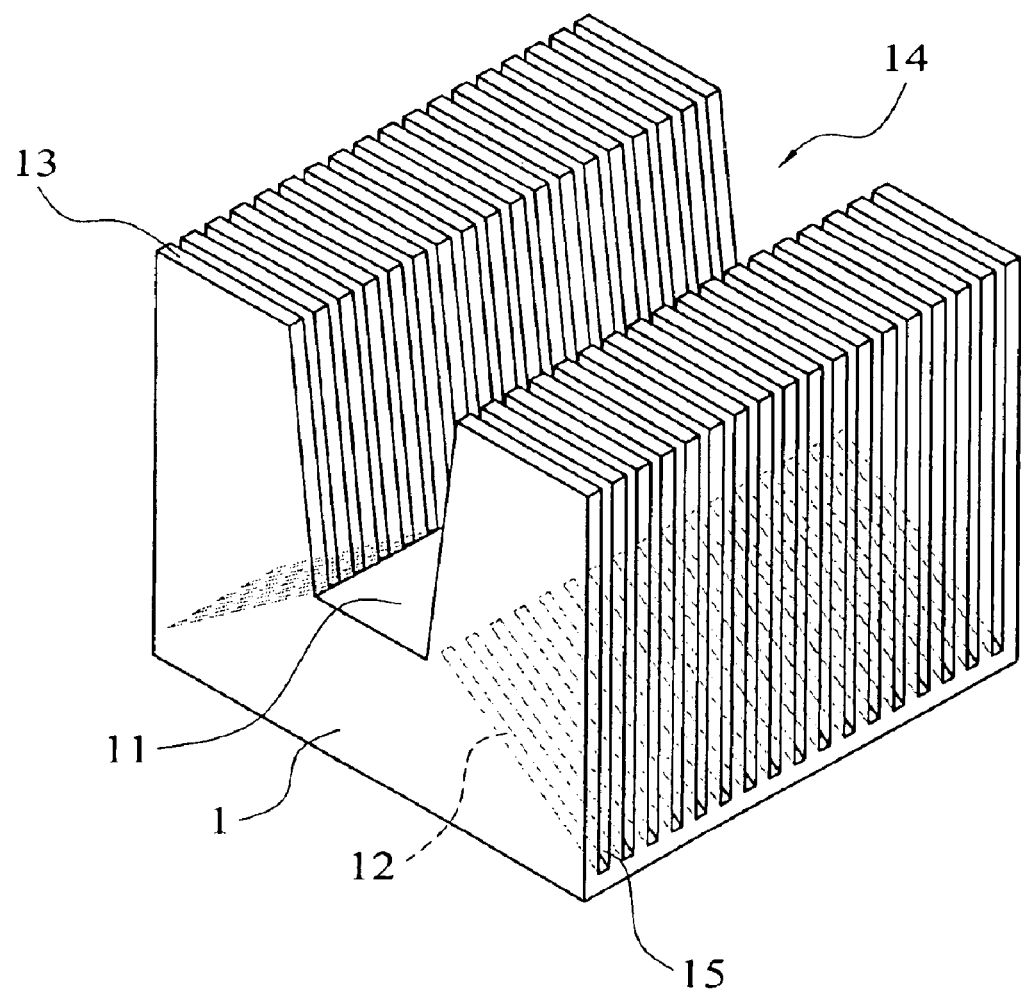
FIG. 1 is a perspective view of the first preferred embodiment according to the present invention.

Please refer to FIG. 1, FIG. 2, FIG. 3, and FIG. 4, which are a perspective view of the first preferred embodiment, a perspective side view of the first preferred embodiment for manufacturing, a perspective view of the metal block of the first preferred embodiment for manufacturing, and a perspective view of the first preferred embodiment showing status on manufacturing according to the present invention. As shown in FIG. 1, the present invention is a heat sink with guiding fins, comprising a base 1 having a plate part 11, wherein each side of a pair of two opposite sides of the plate part 11 comprises a declining part 12; and two groups of fins 13 extended up against the two declining parts 12. The fins 13 and the base 1 can be integrally formed. A concave part 14 whose top width is wider than the bottom width is formed by the plate part 11 and the two groups of fins 13. The concave part 14 can be tied in with a clip or can comprise a slot tied in with a clip to fasten said heat sink on a processor (not shown in the figures). And there is a proper gap 15 between each two neighboring fins 13.

Figure 2:
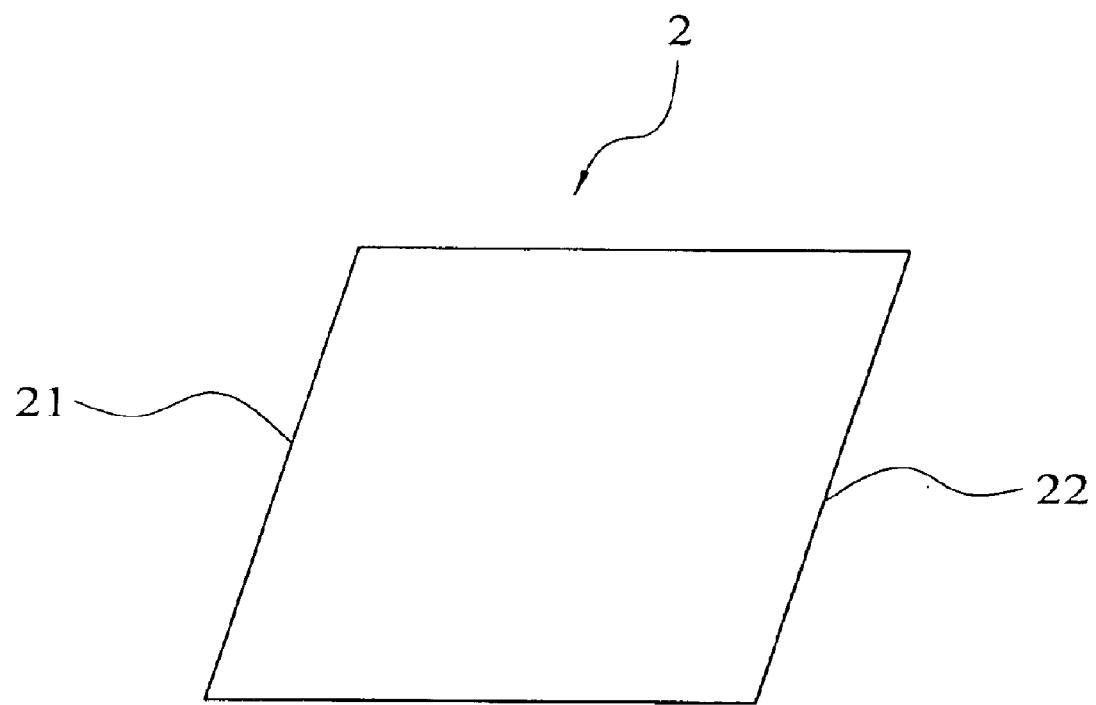
FIG. 2 is a perspective side view of the metal block of the first preferred embodiment for manufacturing according to the present invention.
Figure 3:
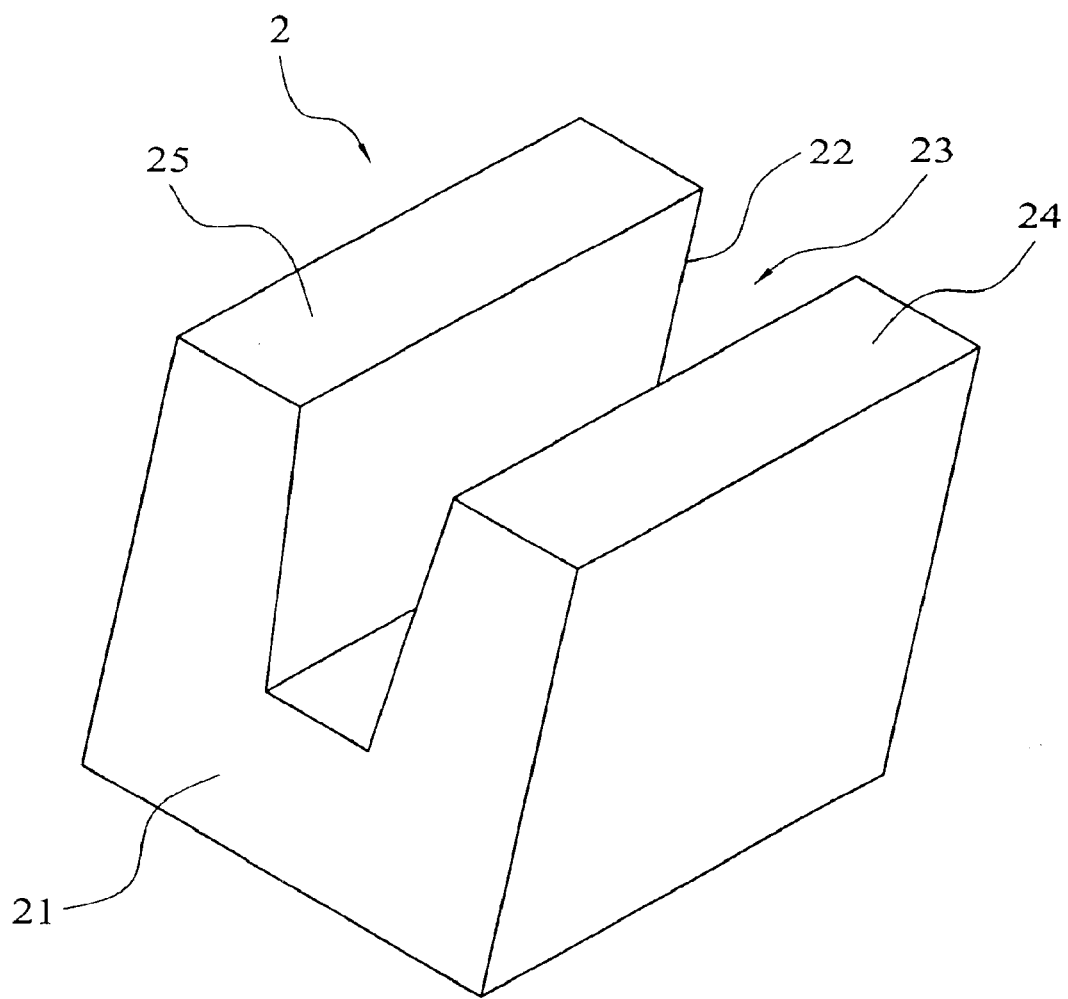
FIG. 3 is a perspective view of the metal block of the first preferred embodiment for manufacturing according to the present invention.
Figure 4:
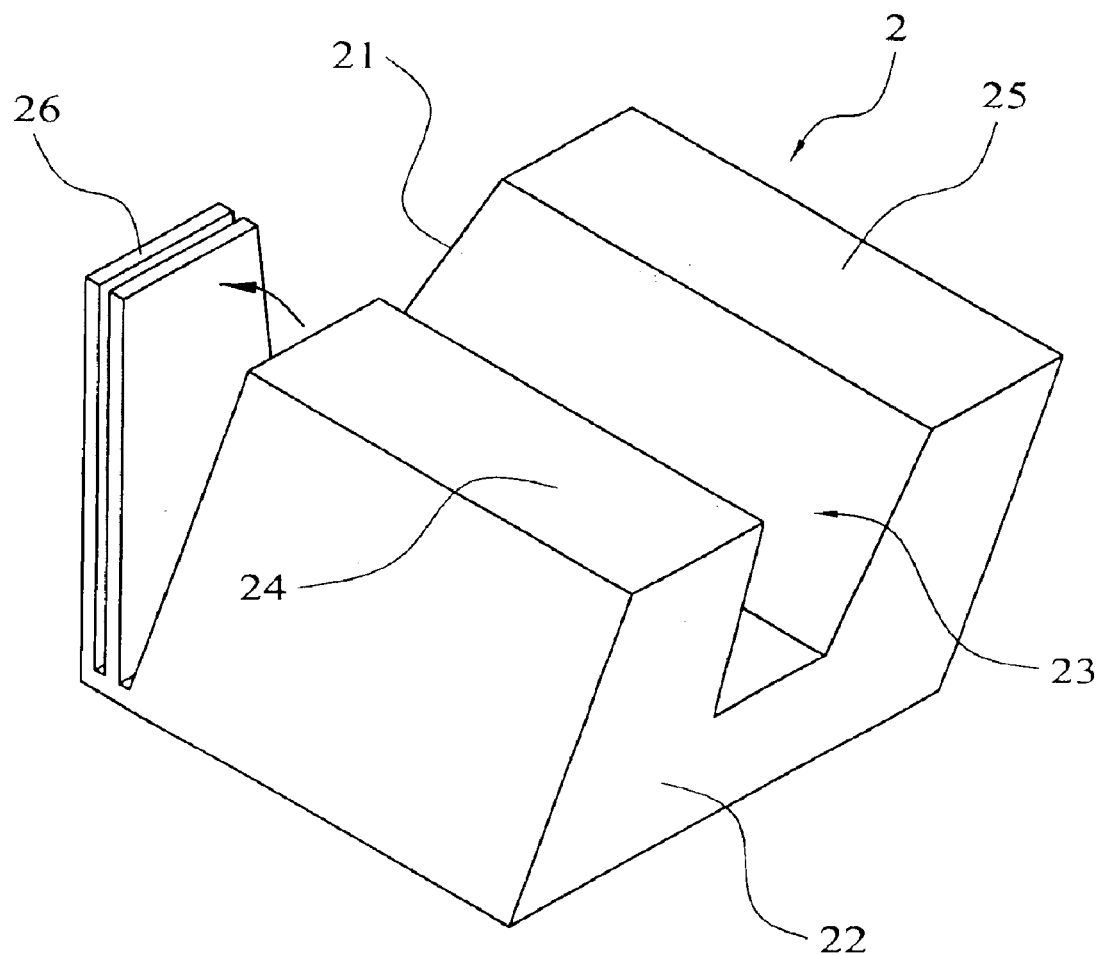
FIG. 4 is a perspective view of the first preferred embodiment showing status on manufacturing according to the present invention.

The method for the above heat sink with guiding fins comprises the steps of: (as shown in FIG. 2, FIG. 3, FIG. 4, and FIG. 4)

(a) obtaining a metal block 2 with two parallel ramps 21,22, wherein the metal block 2 have a better heat conductivity, wherein there is a concave part 23 at the middle of an end surface of the metal block 2 connecting the two ramps 21,22 and so forming two convex parts 24,25, and wherein the top width of the concave part 23 is wider than or equal to the bottom width of the concave part 23;

(b) cutting at one of the ramps 21 on a side of the concave part 23 with a cutting tool, wherein the tool is tilted to cut a fin 26 on the side of the concave part 23;

(c) adjusting the fin 26 to be perpendicular after cutting, and cutting and adjusting another fin 26 after cutting the fin 26 and adjusting the fin 26 to be perpendicular, and repeating the cutting and adjusting to obtain a predestined number of fins on said side of said concave part 26; and (d) repeating the cutting and adjusting of step (b) and step (c) at the other ramp. 25 on the other side of the concave part 23 and so obtaining a heat sink from the metal block 2 following the above steps.

Thereby, a novel heat sink with guiding fins is constructed according to the above structure.

Figure 5:
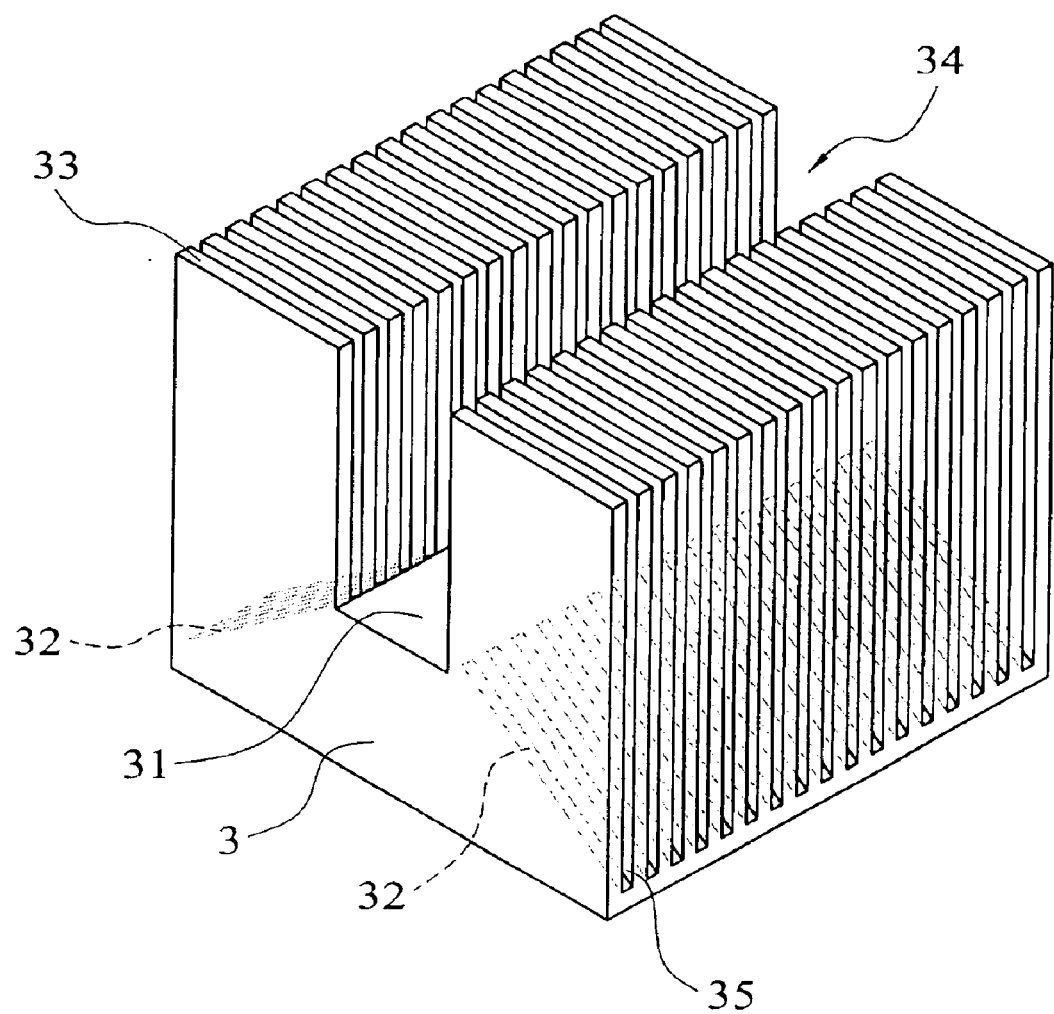
FIG. 5 is a perspective view of the second preferred embodiment according to the present invention.

Please refer to FIG. 5, which is a perspective view of the second preferred embodiment according to the present invention. As shown in FIG. 5, the present invention is a heat sink with guiding fins, comprising a base 3 having a plate part 31, wherein each side of two opposite sides of the plate part 31 comprises a declining part 32; and two groups of fins 13 extended up against the two declining parts 12. The fins 13 and the base 1 can be integrally formed. A concave part 14 whose top width is equal to the bottom width is formed by the plate part 11 and the two groups of fins 13. And there is a proper gap 15 between each two neighboring fins 13.

Figure 6:
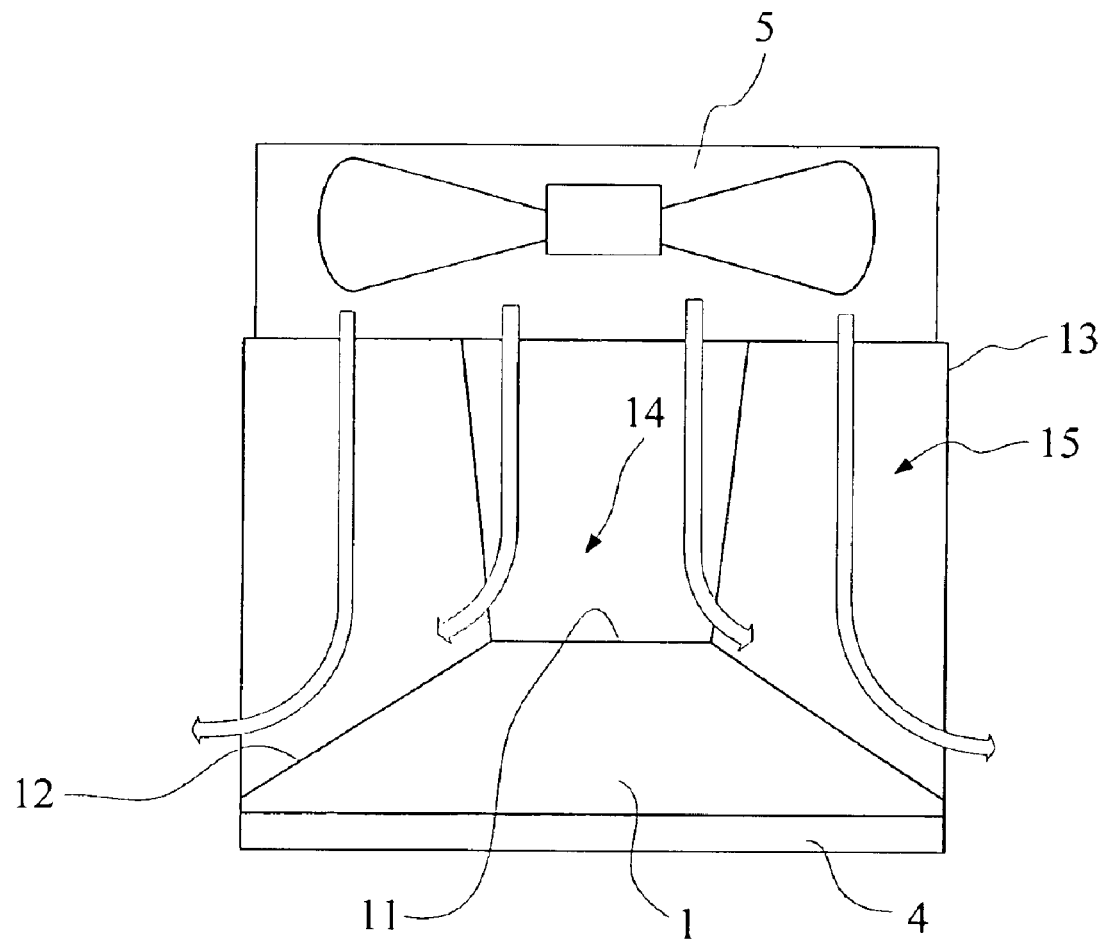
FIG. 6 is a perspective view of the first preferred embodiment showing status on use according to the present invention.
Figure 7:
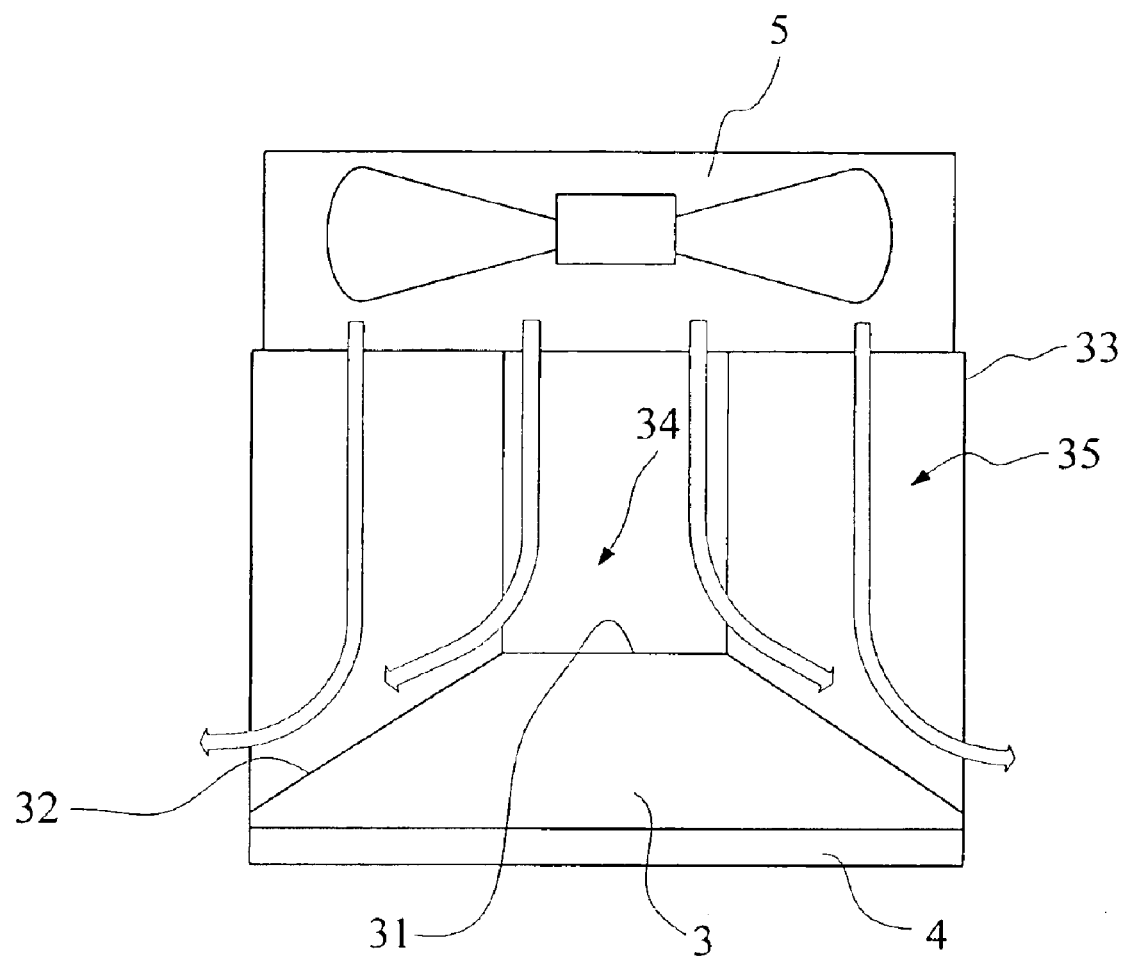
FIG. 7 is a perspective view of the second preferred embodiment showing status on use according to the present invention.

Please refer to FIG. 6 and FIG. 7, which is a perspective view showing status on use according to the present invention. As shown in FIG. 6, when utilizing, the bottom surface of the base 1 of the second preferred embodiment can stick on the processor 4 and a fan 5 can be applied on the fins 13 for heat dissipation through the following process:

(1) When heat is generated as the processor 4 runs (the fan 5 also runs at the same time), the bottom surface of the base 1 absorbs the heat 4 and transfers it to the fins 13.

(2) The flow the fan 5 generates is guided to the fins 13 and then to the declining part 12 on both sides of the base 1 through the gaps 15 between the fins 13 and the concave part 14 whose top width is wider than its bottom width.

The flow is formed into a streamline through the declining parts 12 and a pressure is added through the concave part 14, so that the wind resistance of the flow becomes smaller and the heat dissipation of the present invention is better.

Please refer to FIG. 7, which is a perspective view of the second preferred embodiment showing status on use according to the present invention. The bottom surface of the base 3 of the second preferred embodiment can stick on the processor 4 and a fan 5 can be applied on the fins 33 for heat dissipation through the following process:

(1) When heat is generated as the processor 4 runs (the fan 5 also runs at the same time), the bottom surface of the base 3 absorbs the heat and transfers it to the fins 33.

(2) The flow the fan 5 generates is guided to the fins 33 and then to the declining parts 32 on both sides of the base 1 through the gaps between the fins 33 and the concave part 34.

The flow is formed into a streamline through the declining parts 32 so that the wind resistance of the flow becomes smaller and the heat dissipation of the present invention is better.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A heat sink with guiding fins comprising:

a) a base having:
        i) a plate part; and
        ii) two declining parts, each of the two declining parts extending downwardly from an edge of the plate part;
    b) two groups of fins, each fin of the two groups of fins extending upwardly from one of the two declining parts and being spaced apart from each adjacent fin; and
    c) a concave part defined by an interior surface of each of the two groups of fins and the plate part connected to an edge of each of the two groups of fins.

2. The heat sink according to claim 1, wherein the base and the two groups of fins are integrally formed.

3. The heat sink according to claim 1, wherein the base and the two groups of fins are made of a material selected from a group consisting of copper and aluminum.

4. The heat sink according to claim 1, wherein the concave part has a top having a width equal to a width of a bottom thereof.

5. The heat sink according to claim 1, wherein the concave part has a top having a width larger than a width of a bottom thereof.

6. A method for manufacturing a heat sink with guiding fins, which comprises the steps of:

a) forming a metal block having two parallel ramps, two convex parts, a concave part located between the two convex parts, and a plate part formed at a bottom of the concave part, a first of the two parallel ramps is formed at an angle less than 90 degrees from a block bottom of the block;
    b) cutting each of the two convex parts to form a fin and a declining part extending downwardly from an edge of the plate part;
    c) bending each fin to be perpendicular to the block bottom of the block; and
    d) repeating the cutting step b) and the bending step c) until a predetermined number of spaced apart fins are form.

7. The method according to claim 6, wherein in the forming step a) the metal block is selected from a group consisting of copper and aluminum.

8. The method according to claim 6, wherein in the forming step a) the concave part has a top having a width equal to a width of a bottom thereof.

9. The method according to claim 6, wherein in the forming step a) the concave part has a top having a width larger than a width of a bottom thereof.

* * * * *